(12) United States Patent
Frahm et al.

(10) Patent No.: US 7,692,198 B2
(45) Date of Patent: Apr. 6, 2010

(54) WIDE-BANDGAP SEMICONDUCTOR DEVICES

(75) Inventors: Robert Frahm, Flemington, NJ (US);
Hock Min Ng, Westfield, NJ (US);
Brijesh Vyas, Warren, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 281 days.

(21) Appl. No.: 11/676,329

(22) Filed: Feb. 19, 2007

(65) Prior Publication Data

US 2008/0197358 A1  Aug. 21, 2008

(51) Int. Cl.
*H01L 29/20* (2006.01)
(52) U.S. Cl. ........... 257/76; 257/E21.382; 257/E29.013
(58) Field of Classification Search .................. 257/13, 257/79–103, 918, E51.018–E51.022, E33.001–E33.077, 257/E33.054, E25.028, E25.032, 26, 76, 257/125, 164, 198, 514, E29; 438/22–47, 438/69, 493, 503, 507, 956
See application file for complete search history.

(56) References Cited

U.S. PATENT DOCUMENTS 6,261,929 B1  7/2001  Gehrke et al.

2002/0090816 A1  7/2002  Ashby et al.
2004/0157358 A1*  8/2004  Hiramatsu et al. ............ 438/93
2007/0248132 A1*  10/2007  Kikuchi et al. ........... 372/44.01

FOREIGN PATENT DOCUMENTS

| WO | 9965068 A1 | 12/1999 |
| WO | 0033365 A1 | 6/2000 |
| WO | 2007107757 A2 | 9/2007 |

OTHER PUBLICATIONS

Hu, et al., High-efficiency light-emitting column-crystallized InGaN/GaN quantum-well flower structure on micropillared Si substrate, 2006 American Institute of Physics,Appl. Phys. Lett. 89, pp. 171903-1 through 171903-3.
Ponce, et al, Nitride-based semiconductors for blue and green light-emitting devices, Nature, vol. 386, Mar. 27, 1997, pp. 351-359.
PCT International Search Report dated Sep. 18, 2008 for PCT International Application No. PCT/US2008/002143; 11 pages.

* cited by examiner

*Primary Examiner*—Wai-Sing Louie
*Assistant Examiner*—Sue Tang
(74) *Attorney, Agent, or Firm*—Hitt Gaines, PC

(57) ABSTRACT

A device 100 comprising a substrate 115 having crystal-support-structures 110 thereon, and a III-V crystal 210. The III-V crystal is on a single contact region 140 of one of the crystal-support-structures. An area of the contact region is no more than about 50 percent of a surface area 320 of the III-V crystal.

20 Claims, 6 Drawing Sheets

WIDE-BANDGAP SEMICONDUCTOR DEVICES

TECHNICAL FIELD OF THE INVENTION

The present invention is directed, in general, to a semiconductor device having one or more III-V crystals and methods of manufacturing thereof.

BACKGROUND OF THE INVENTION

III-V crystals are of interest in a number of optical and electronic applications because these crystals can have a wide band gap. E.g., in certain opto-electronic devices, III-V crystals can be used to emit light at wavelengths (e.g. blue light) that would otherwise be difficult to attain. It can be difficult, however, to grow epitaxial layers of III-V crystals, or to grow such crystals to a suitable size for practical application. It can also be difficult to grow epitaxial layers of III-V crystals on particular types of crystalline substrates, e.g., silicon, because the lattice constant of the III-V crystals does not match the lattice constants of the substrates. In particular, growing a group III-V crystal on a substrate with different lattice constants typically caused defects to be formed in the group III-V crystal. If a grown III-V crystal has an excessive number of defects, then the opto-electronic properties of the crystal will suffer (e.g., decreased light emitting efficiency, or substantially increased or decreased electrical resistivity).

SUMMARY OF THE INVENTION

One embodiment is a device. The device comprises a substrate having crystal-support-structures thereon and a III-V crystal. The III-V crystal is on a single contact region of one of the crystal-support-structures. An area of the contact region is no more than about 50 percent of a surface area of the III-V crystal.

Another device embodiment comprises the III-V crystal. The III-V crystal has a uniform crystal orientation except for a defect region that is located centrally from said III-V crystal. The defect region occupies less than about 10 percent of a total volume of the III-V crystal.

Another embodiment is a method of manufacturing a device. The method comprises forming crystal-support-structures on a substrate, wherein each of the crystal-support-structures has a pre-defined contact region. The method further comprises growing a III-V crystal on the contact region of one of said crystal-support-structures, an area of the contact region being no more than about 50 percent of the surface area of the grown III-V crystal.

BRIEF DESCRIPTION OF THE DRAWINGS

The invention is best understood from the following detailed description, when read with the accompanying FIGUREs. Various features may not be drawn to scale and may be arbitrarily increased or reduced in size for clarity of discussion. Reference is now made to the following descriptions taken in conjunction with the accompanying drawings, in which.

DETAILED DESCRIPTION

The present inventions benefit from the recognition that the number of defects in III-V crystals can be reduced by initiating the growth of the crystals on micro- or nano-sized crystal-support-structures. As crystal's growth extends beyond a contact region with the support-structure, the problem of there being a lattice mismatch between the crystal and support-structure is reduced because the bulk of the crystal is in free space, air, or another gas/fluid. Because the bulk of the crystal contacts at most, a non-solid, the number of defects in the final crystal is reduced. Moreover, the defects can be localized to the vicinity around the contact region of the crystal-support-structure.

The term III-V crystal as used herein refers to a crystal that is substantially an alloy having at least one type of atom from Group 13 (i.e., group 3A using the American convention) and one type of atom from Group 15 (i.e., group 5A using the American convention) of the Periodic Table of Elements (IUPAC convention for Group labels). The term III-nitride crystal as used herein refers to a crystal that is substantially an alloy containing at least one type of atom from Group 13 and nitrogen atoms. Exemplary III-V crystals include crystals formed substantially of the binary alloys GaN, AlN, InN, and other alloys such as $Al_xGa_{1-x}N$, $In_xGa_{1-x}N$, $In_xAl_{1-x}N$, and $Al_xIn_yGa_{1-x-y}N$. III-V crystals include crystals of such alloys that are intrinsically or extrinsically doped, e.g., with conductivity altering impurity atoms.

The term crystal-support-structure as used herein refers to a predefined raised feature on a surface, wherein the structure has at least one lateral dimension that is about 1 mm or less and preferably smaller than about 0.1 mm. The crystal-support-structures can be nanostructures (at least one lateral dimension about 1 micron or less) or microstructures (at least one lateral dimension about 1 millimeter or less). The term contact region refers to the area of the nanostructure that directly contacts the III-V crystal or that the growth or the III-V crystal is initiated from.

One embodiment of the present invention is a method of manufacturing an apparatus. FIGS. 1-10 present cross-section views and perspective views of example devices at selected stages of manufacture. In some embodiments, the device 100 is configured as a light-emitting or light-detecting device, or transistor.

Figure 1:
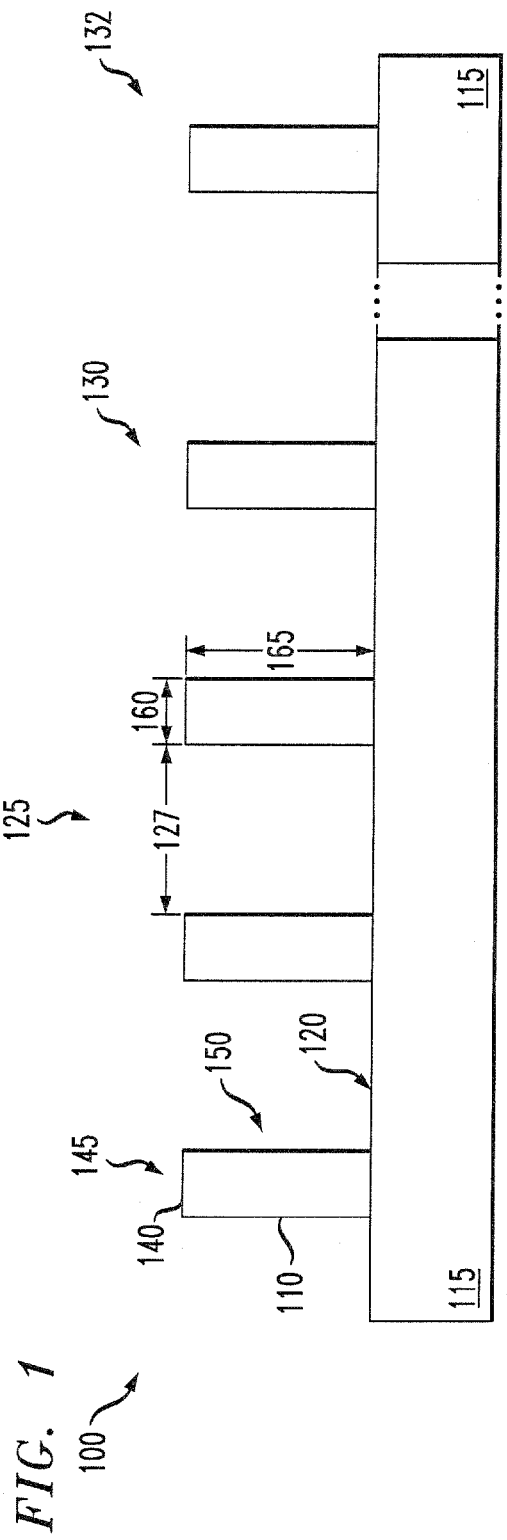
FIG. 1 presents a cross-sectional view of an example device after forming crystal-support-structures on a substrate.

FIG. 1 presents a cross-sectional view of a device 100 (e.g., a semiconductor device, such as an optoelectronic device) 100 after forming crystal-support-structures 110 on a substrate 115. As illustrated the crystal-support-structures 110 are raised features above a base 120 of the substrate 115. For example, the structures may have lateral walls that are substantially perpendicular to the surface of the substrate 115.

In some cases, the crystal-support-structures 110 are formed from the substrate 115. E.g., a substrate 115 composed of a substrate (e.g., silicon, sapphire) can be patterned (e.g. photolithography) and etched (e.g., reactive ion etching), or micro-machined, using conventional processes. The crystal-support-structures 110 and the substrate 115 can both be made of crystalline silicon. Silicon is desirable for its low cost and the ability to pattern or machine silicon via numerous commercially available processes. In some cases, it is also desirable for the crystal-support-structures 110, the substrate 115, or both, to be made of electrically conductive material (e.g., silicon or extrinsically doped silicon).

As illustrated the crystal-support-structures 110 can be configured as pillars. The pillars can be cylindrically shaped, although other shapes (e.g., cones, cubes, prisms, pyramids etc . . . ) can be used. In some cases, the crystal-support-structures 110 are configured as closed-cells (e.g., hexagonally shaped cells). Crystal-support-structures 110 may be configured as closed cells that can be interconnected to other closed cells or be free-standing. Hexagonal shaped closed-cells are sometimes preferred because this structure is easier to manufacture than e.g., circular cells, and because this structure is inherently mechanically stable and able to distribute mechanical stresses across the entire structure. Example configurations and methods of fabricating of pillar-shaped and close-cell-shaped crystal-support-structures 110 configured as various types of microstructures or nanostructures that could serve as a crystal-support-structure 110 are further discussed in U.S. patent application Ser. Nos. 10/835,639 to Kroupenkine filed Apr. 30, 2004 and 11/460,901 to Kroupenkin filed Jul. 28, 2006 which are both incorporated by reference herein in their entirety.

A plurality of pillar- or closed-cell-shaped crystal-support-structures 110 can form a micro- or nanostructured surface 125 on the substrate 115. The crystal-support-structures 110 on the surface 125 can be evenly spaced apart from each other, or variably spaced apart. In some cases, a lateral separation 127 between adjacent pillar-shaped crystal-support-structures 110 is greater than a lateral thickness of the grown III-V crystal (e.g., thickness 310 in FIG. 3). This facilitates the formation of grown crystals that remain separated from each other. In other cases, the lateral separation 127 between adjacent ones of pillar-shaped crystal-support-structures 110 is made smaller than this to facilitate the merger of crystals formed on the adjacent pillar-shaped shaped crystal-support-structures 110.

It is sometimes desirable to have one or more groups 130 of crystal-support-structures 110 on the substrate 115. E.g. about 10 to 100 crystal-support-structures 110 configured as pillars or interconnected closed-cells are more closely spaced to adjacent members of their group 130 than to other crystal-support-structures 110 in different groups 132. Such configurations can facilitate the formation of larger crystals, e.g., a thin film III-V crystal that contacts a plurality crystal-support-structures 110 in the group 130.

As further illustrated in FIG. 1, each of the crystal-support-structures 110 has a pre-defined contact region 140. The contact region 140 is an exposed portion of the crystal-support-structures 110. It is sometimes desirable for there to be a single contact region 140 on each of the crystal-support-structures 110, because this promotes the growth of a single crystal with a minimum of defects. Forming multiple crystals on a crystal-support-structures 110 (e.g., by having multiple contact regions 140 per structure 110) may result in the formation of multiple defect sites at points where the crystals contact each other, and can limit the size of individual crystals.

In some cases, the contact region 140 is located on an upper surface 145 of the crystal-support-structures 110, and may comprise the entire upper surface 145 of the structure 110. Having the contact region 140 on the upper surface 145 facilitates the formation of large crystals on individual one, or groups 130, of the crystal-support-structures 110. Having the contact region 140 on the upper surface 145 can also be advantageous when the objective is to form an array of crystals all in the same plane, e.g., the same plane as the substrate 115 that the structures 110 are formed on. In others cases, however, the contact region 140 can be located on a sidewall 150 of the crystal-support-structures 110. Having the contact region 140 on the sidewall 150 can facilitate the formation of crystals that bridge adjacent crystal-support-structures 110.

It is advantageous for the pre-defined contact region 140 to be small compared to the desired final size of the grown crystal, because this helps to minimize the extent of defects in the crystal. A small contact region 140 is facilitated by having the contact region 140 on the upper surface 145 of crystal-support-structures 110 with a small lateral dimension 160. E.g., when the crystal-support-structure 110 is configured as a pillar, at least one dimension that is about 1 mm or less can be a lateral dimension 160 corresponding to the diameter of the pillar.

The diameter 160 is carefully designed to balance several factors. It is desirable to make the diameter 160 small so as to minimize crystal defects by minimizing the size of the contact region 140. However, the diameter must be large enough to provide mechanical support and stability to the crystal. In some cases the diameter 160 must be large enough to permit electrical conduction through the crystal-support-structures 110. In some preferred embodiments, the pillar-shaped crystal-support-structure 110 has a diameter 160 ranging from about 100 to 300 nanometers.

In some cases, it is desirable for the height 165 of the structure 110 to be at least about 2 times greater than a vertical thickness of grown III-V crystal (e.g., the thickness 312 depicted in FIG. 3 below) so that the grown crystal does not touch the base 120 or any crystal deposition material thereon, and thereby form defects in the crystal. In some preferred embodiments, the height 165 is in the range of about 2 to 10 microns.

It is desirable to configure the contact region 140 to facilitate the seeding and growth of an epitaxial III-V crystal. In some cases, the contact region 140 has a substantially similar lattice geometry of atoms as the lattice geometry of atoms in the III-V crystal to be grown thereon. Selecting a lattice geometry for the contact region 140 to correspond to that of the crystal helps promote the epitaxial growth of the crystal with a minimum of defects. In some preferred embodiment, a crystal lattice of the contact region 140 and said III-V crystal 210 are both substantially hexagonal geometries. E.g., when the crystal has a hexagonal crystal structure (e.g., a III-nitride crystal like GaN or InN), then crystal-support-structures 110 can be formed from a silicon wafer, or a silicon layer on the substrate 115, that has a (111) orientation. In such instances, the contact region 140 located on the upper surface 145 of the structure 110 will have a hexagonal lattice arrangement of atoms. Similarly, when the crystal has a cubic crystal structure (e.g., GaAs or InP), then crystal-support-structures 110 can be formed by vertically etching a silicon wafer-substrate having a (100) orientation. In such instances, the contact region 140 on the upper surface 145 of the structure 110 will have a cubic lattice arrangement of atoms.

It is not necessary for each of the crystal-support-structures 110 to have identical shape or dimensions. It is also not necessary that separations between the crystal-support-structures 110 are identical to each other or that said structures are all interconnected or all free-standing. However, such unitary configurations are sometimes preferred for ease of manufacture.

Figure 2:
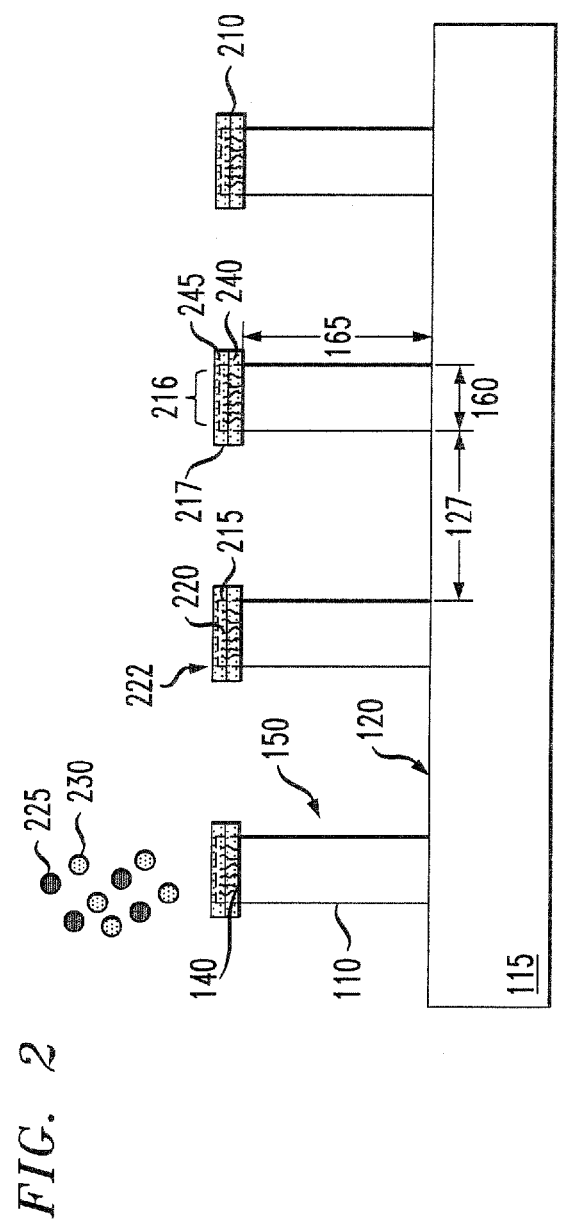
FIG. 2 shows the device while growing a III-V crystal on the contact region of crystal-support-structures of an example device.

FIG. 2 shows the device 100 while growing a III-V crystal 210 on the contact region 140. In some cases, it is desirable for the III-V crystal 210 to be composed of a III-nitride, because III-nitrides typically have large bandgaps. Also, the crystals 210 formed from such alloys facilitate lateral growth to form e.g., hexagonal plates.

The initial portion of the crystal 210 that forms directly on the contact region 140 is termed the defect region 215. The term defect regions 215 as used herein is defined as that portion of the crystal 210 having a substantially elevated concentration of lattice defects, e.g., dislocations or disinclinations. Typically, the concentration of the various types of lattice defect, e.g., threading defects, would be expected to be at least about 10 or more times higher, or even about 100 or more times higher in the defect region 215 than in other regions of the same crystal 210. Because the crystal 210 can grow outward in all directions from the defect region 215 (except the contact region), the defect region 215 is typically centrally located in the crystal 210. That is, the defect region 215 is located in a central portion 216 of the crystal that is away from one or more a lateral edge 217 of the crystal 210.

The defect region 215 is typically adjacent to the contact region 140. The defect region 215 can be identified and its total volume substantially quantified by inspecting plan or cross-sectional views of transmission electron microscope (TEM) images of the grown III-V crystal 210. For instance, in a III-nitride crystal 210 (e.g., InN or GaN), the defect region 215 can include one or more thread defects 220 in the crystal's hexagonal shape that project vertically above the contact region 140, but not laterally. Examples of such threading defects in a III-V crystal are presented in F. A. Ponce and D. P. Bour, Nature 386:351-59 (1997), which is incorporated by reference herein in its entirety. In some embodiments of the device 100, the defect region 215 occupies less than about 10 percent of a total volume of the III-V crystal 210. In some cases, thread defects 220, and hence defect region 215, do not extend all the way to the other side 222 of the crystal (e.g., the side opposite to the side that is adjacent to the contact region 140). In other cases, the thread defect 220 density of crystal 210 adjacent to the side 222 opposite to the contact region 140 is lower than the thread defect 220 density of the crystal 210 adjacent to the contact region 140.

In some preferred embodiments of the device 100, the III-V crystal 210 has a low defect density, except for the defect region 215 located adjacent to the contact region 140. The term low defect density as used herein is defined as a threading defect 220 density of less than about $1\times10^8$ cm$^{-2}$. The defect region 215 generally has a threading defect 220 density of more than about $1\times10^8$ cm$^{-2}$. In some embodiments the threading defect 220 density in the defect region 215 is about 10, and in some cases 100 times, greater than the threading defect 220 density elsewhere in the crystal 210. E.g., in some embodiments, a threading defect 220 density in the defect region 215 is about $1\times10^8$ cm$^{-2}$ or greater and a thread defect density of the III-V crystal 210 outside of the defect region 215 is less than about $1\times10^7$ cm$^{-2}$, and more preferably, less about $1\times10^6$ cm$^{-2}$.

The relative rates of vertical and lateral growth of the crystal 210 can be further controlled by adjusting the relative amounts of group-III atoms 225 and group-V atoms 230 that the contact region 140 is exposed to. Growing the III-V crystal 210 can include exposing the contact region 140 to group-III atoms 225 and to group-V atoms 230 in a ratio that promotes a faster lateral growth than a vertical growth of the III-V crystal 210. E.g., when growing III-nitride crystals like GaN or InN, exposing the contact region 140 to group-III atoms 225 and group-V atoms 230 in a ratio of greater than about 1:1 (e.g., group-III atoms:group-V atoms) promotes faster lateral growth than vertical growth. The ratio can similarly be adjusted to promote a faster vertical growth of crystal over lateral growth by e.g., changing the ratio to less than about 1:1.

In some preferred embodiments, the epitaxial growth of the III-V crystal 210 is facilitated through the use of molecular beam epitaxy (MBE) process. E.g., consider the case when a III-nitride crystal 210 is grown on silicon crystal-support-structure 110. The MBE process can include a radiofrequency plasma using a feed gas of $N_2$ (about 0.1 to 1 sccm) and plasma power of about 250 to 400 Watts. Different feed gases could be used to generate group-V atoms 230 other than nitrogen. The MBE process can further include a metal source (e.g., an effusion cell) whose temperature (e.g., about 900 to 1050° C. for Ga, about 700 to 850° C. for In, about 1050 to 1250° C. for Al) is adjusted to a range that permits different group-III atom 225 fluxes. The relative amounts of group-III atoms 225 and to group-V atoms 230 presented to the contact region 140 can be adjusted by changing the flow rate of the feed gases, the temperature of the metal source, or both.

The MBE process can further include adjusting the temperature of the substrate 115, or entire device 100, to facilitate the formation of epitaxial crystal 210. It is important for the substrate's 115 temperature to not be too high as to evaporate the group-III atoms 225 from the contact region 140. It is also important for the substrate's temperature to not be too low as to promote the deposition of metal droplets of group-III atoms 225. The appropriate temperature of the substrate 115 depends upon which group III atoms 225 are being used. E.g., for In, Ga, and Al, the substrate's 115 temperature preferably ranges from about 350 to 500° C., about 650 to 800° C., and about 700 to 900° C., respectively.

One skilled in the art would appreciate that the particular conditions of the MBE process would be adjusted to facilitate the presentation of the group III-atoms and group V-atoms. One skilled in the art would also understand that techniques other than MBE, e.g., vapor phase epitaxial methods, could be used.

The III-V crystal 210 can comprise more than one layer. For instance after forming a crystal of the desired lateral thickness, the MBE process can be adjusted to promote the vertical growth of the crystal 210. Moreover, the feed gas or metal source can be changed to form III-V crystal layers having different compositions. E.g., as illustrated in FIG. 2, the III-V crystal can have an n-type III-V layer 240 composed of Si-doped GaN and a p-type III-V layer 245 composed of Mg-doped GaN. Additional examples of the composition of multiple layered III-V crystals are provided in U.S. patent application Ser. No. 11/456,428 to Ng filed Jul. 10, 2006, which is incorporated by reference herein in its entirety. One skilled in the art would understand that the composition of the III-V crystal 210 could be adjusted to provide the crystal with the desired band-gap and hence sensitivity to the appropriate wavelength of light.

Figure 3:
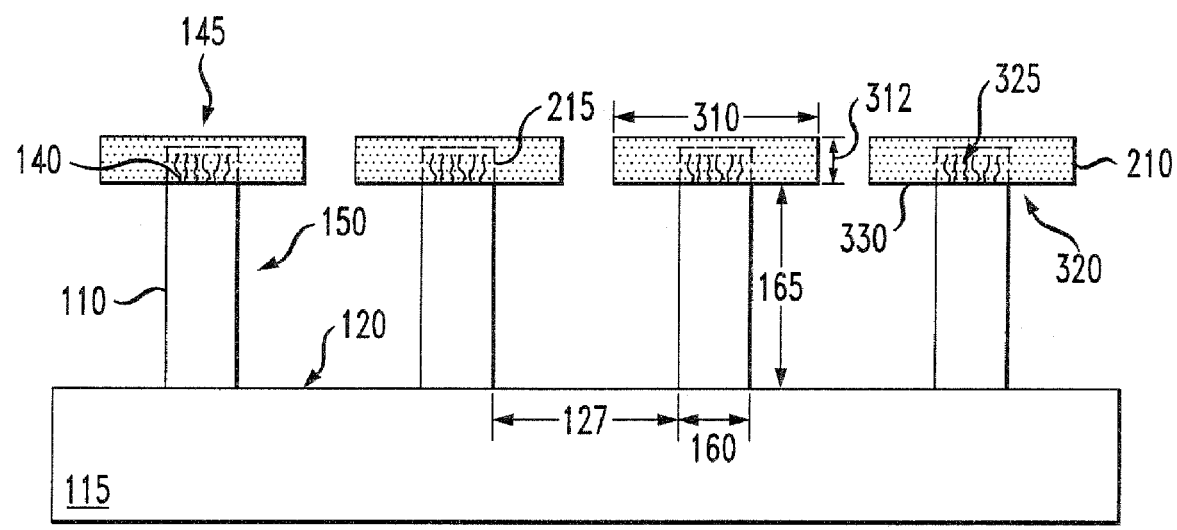
FIG. 3 shows the device at the completion of a III-V crystal's 210 growth of an example device.
Figure 4:
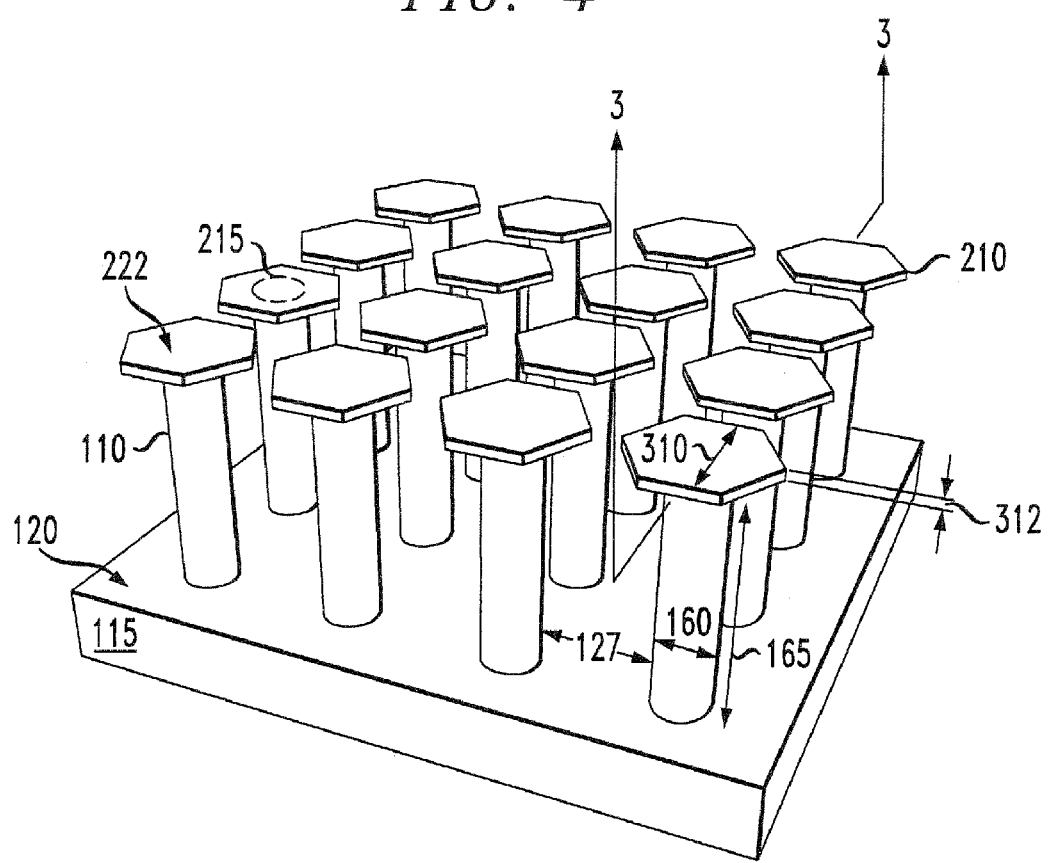
FIG. 4 shows a perspective view of the device at the same stage of manufacture as shown in FIG. 3.

FIG. 3 shows the device 100 at the completion of the crystal's 210 growth. FIG. 4 shows a perspective view of the device 100 at the same stage of manufacture as shown in FIG. 3; the cross-section view in FIG. 3 corresponds to view line 3-3 in FIG. 4.

In some cases, the growth of the crystal 210 is terminated such that there are individual III-V crystals 210 separately formed on each of the crystal-support-structures 110. In such cases, the lateral separation 127 between the adjacent individual crystal-support-structures 110 is greater than a lateral thickness 310 of the grown III-V crystal 210. In cases where the crystal's shape approximates that of a circular plate (e.g., a hexagonal plate such as formed in certain III-nitride crystals), then the crystal's lateral thickness 310 corresponds to a diameter of the crystal 210. E.g., in some cases, the diameter 160 of pillar-shaped crystal-support-structures 110 is about 10 percent or less than the average lateral thickness 310 (e.g., diameter) of the grown III-V crystal 210. In some cases each one of the pillar-shaped crystal-support-structures 110 each have diameters 160 that are about 10 percent or less of a lateral thickness 310 than individual ones of the III-V crystal 210 located on the individual crystal-support-structure 110. In some embodiments, the separated crystals 210 (e.g., GaN or InN) have a lateral thickness 310 of from about 1 to 50 microns, and a vertical thickness 312 of from about 1 to 20 microns.

As noted above, the extent of defects in the crystal 210 can be minimized and localized by configuring the crystal 210 to touch only one solid surface, the contact region 140, while the bulk of the crystal contacts air (or whatever other gaseous or liquid medium that surrounds the crystal). It is preferable for the area of the contact region 140 to be substantially less than a surface area 320 of the grown crystal 210. In some preferred embodiments, an area 325 of the contact region 140 is no more than about 50 percent of a surface area 320 of the grown III-V crystal 210 (e.g., the final crystal produced by the growing process). The term surface area 320 as used herein refers to the total surface area of a side 330 of the grown III-V crystal 210 that touches the contact region 140. In some preferred embodiments of the device 100 the area 325 of the contact region 140 is no more than about 50 percent, more preferably no more than about 10 percent, and even more preferably, no more than about 1 percent, of a surface area 320 of the grown III-V crystal 210

Figure 5:
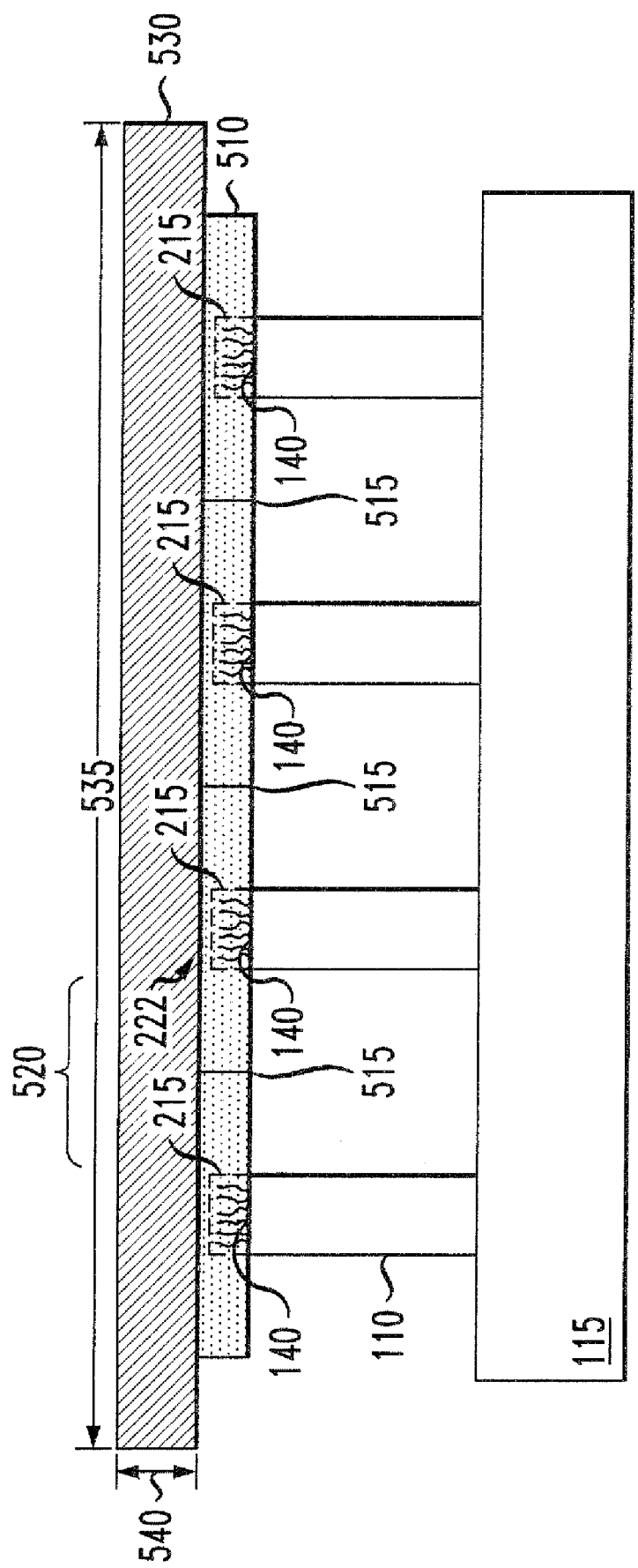
FIG. 5, shows a cross-sectional view of an example device after forming a merged III-V crystal layer.

In some embodiments of the device 100, the growth of the crystals 210 (FIGS. 3-4) is extended until a layer is formed. E.g., FIG. 5 shows a cross-sectional view the device 100 after extending the exposure to group-III and group-V atoms 225, 230 (FIG. 2) until a plurality (e.g., at least two) of the III-V crystals 210 growing on the crystal-support-structures 110 coalesce to form a continuous merged III-V crystal layer 510. E.g., the exposure can include extending the conditions that promote faster lateral growth than a vertical growth of III-V crystal 210 until the layer 510 is formed.

As shown in FIG. 5, the merged layer 510 can touch a plurality of the contact regions 140, each contact region 140 being on a different crystal-support-structure 110. In some embodiments, there can be a plurality of defect regions 215, each emanating above contact regions 140 of the crystal-support-structures 110 that individual crystals 210 (FIG. 2-4) contacted before coalescing to form the merged layer 510. In some cases there can be additional defects 515 at points where the separate crystals merge.

In some cases, the merged layer 510 can be directly used as a light emitting or detecting component of the device 100. Defect-free regions 520 of the layer 510 laying between the crystal-support-structures 110 can be further processed to form, e.g., a light emitting, light detecting or transistor devices. In other cases, such as shown in FIG. 5, the merged layer 510 is used to seed the growth of a thicker III-V crystal film 530 thereon. That is, the merged layer 510 is used as seed layer to grow the III-V crystal film 530 thereon. The use of the merged layer 510 as a seed layer promotes the formation of a larger epitaxial III-V crystal film 520 having fewer defects than the merged layer 510. E.g., in some cases the III-V crystal film 520 has a lateral thickness 535 of at least about 1000 microns, and more preferably at least about 10000 microns, and a vertical thickness 540 of at least about 100 microns and preferably equal to or greater than about 250 microns.

In some embodiments of the device 100, the crystal-support-structures 110 remain as a component part of the device 100. E.g., electrically conductive crystal-support-structures 110 can be configured to provide an electrical connection to the III-V crystal 210. The crystal-support-structures 110 can also serve to hold a plurality of the III-V crystals 210 in a common plane 610 during further fabrication steps of the device, such as illustrated in FIGS. 6 and 7.

Figure 6:
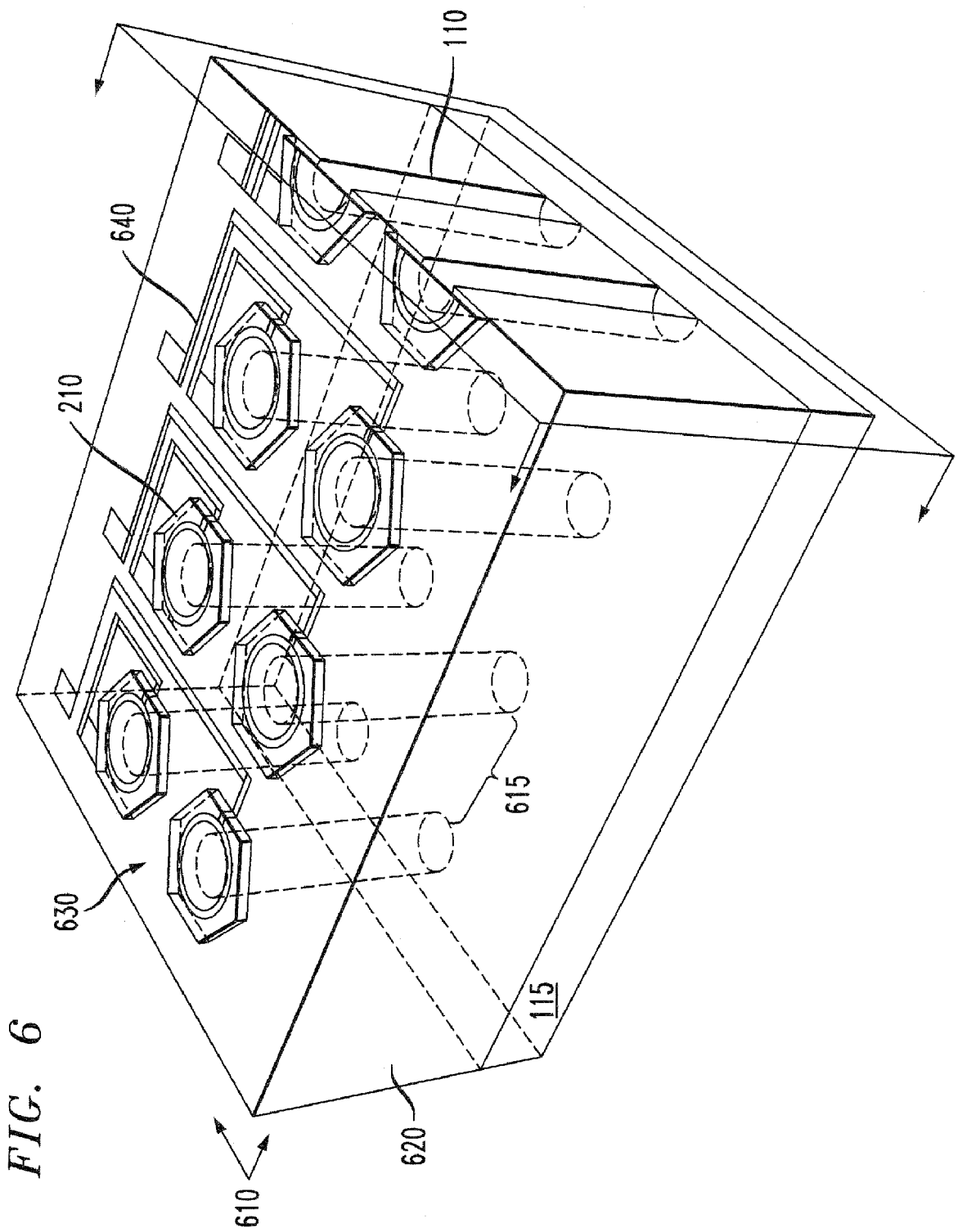
FIG. 6 shows a partially transparent cut-away perspective view of an example device after filling gaps between adjacent ones of the III-V crystals and crystal-support-structures with a polymer.

FIG. 6 shows a partially transparent cut-away perspective view of the device 100, analogous to the view depicted in FIG. 4. FIG. 7 shows a similar non-transparent perspective view. The device 100 in FIGS. 6 and 7 is shown after filling gaps 615 between adjacent ones of the III-V crystals 210 and crystal-support-structures 110 with a polymer 620. E.g., a fluid pre-polymer can be introduced into the gaps 615. In some cases, the polymer 620 is electrically insulating to facilitate electrical isolation between electrically conductive crystal-support-structures 110. Example polymers 620 include polyamide and spin-on glass. In some cases, such as illustrated in FIG. 6, the polymer 620 can be configured to cover the crystal-support-structures 110, but leave the III-V crystal 210 uncovered. The polymer 620 can help to prevent undesired movement of the III-V crystals 210 due to e.g., movement of the device 100.

Figure 7:
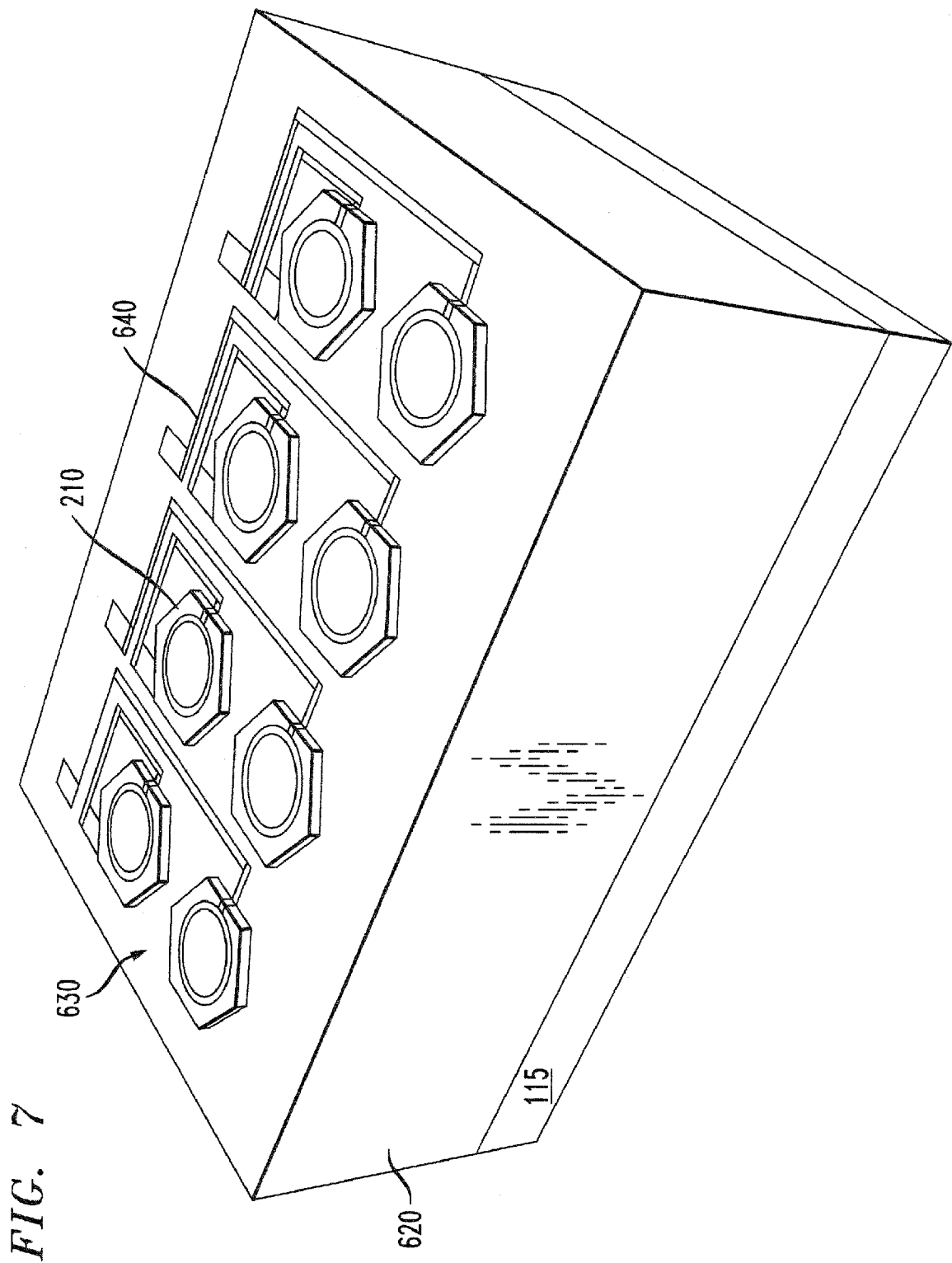
FIG. 7 shows a perspective view of an example device after filling gaps between adjacent ones of the III-V crystals and crystal-support-structures with a polymer.
Figure 8:
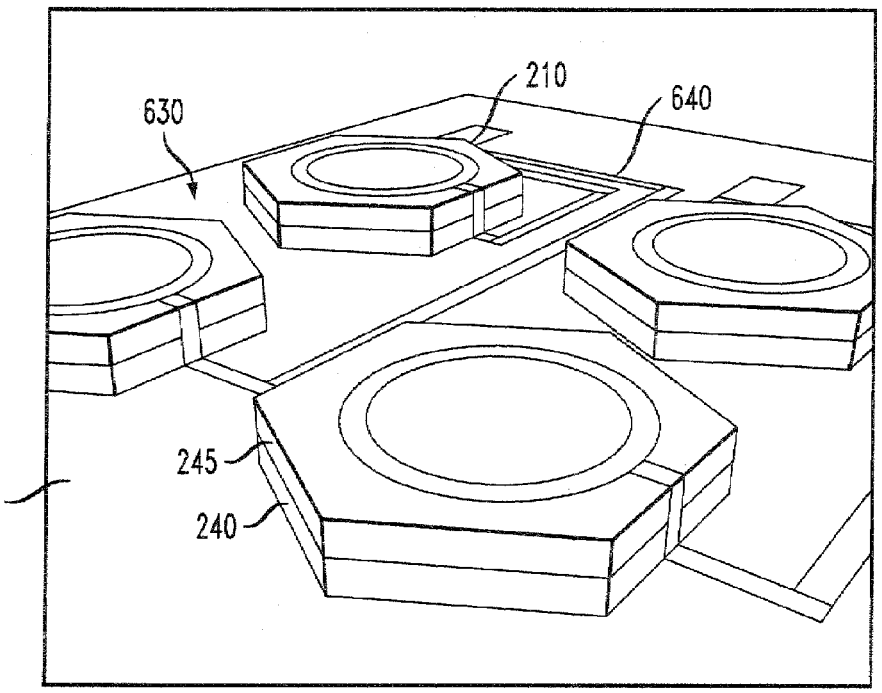
FIG. 8 shows a detailed perspective view of an example device after the forming conductive lines connect to bi-layered III-V crystals.

As further illustrated in FIGS. 6 and 7, the polymer 620 can also provide a surface 630 to support electrically conductive lines 640 that are coupled to the III-V crystals 210. FIG. 8 shows a detailed perspective view of the device 100 after forming conductive lines 640 that connect to bi-layered III-V crystals 210 comprising e.g., an n-type III-V layer 240 and a p-type III-V layer 245. In some embodiments of the device 100, the separated III-V crystals 210 are connected to individual addressable electrically conductive lines 640. One skilled in the art would understand how a conductive material can be deposited on the surface 630 and then patterned to form the conductive lines 640. In some cases, it is desirable to use conductive lines 640 that are transparent to visible light (e.g., indium-tin-oxide) or infrared light (polysilicon).

In other embodiments of the device 100, the crystal-support-structures 110 are removed and therefore these structures 110, and the substrate 115, are not components of the device 100. In such embodiments, further steps are taken to separate the III-V crystal 210 from the crystal-support-structures 110.

Figure 9:
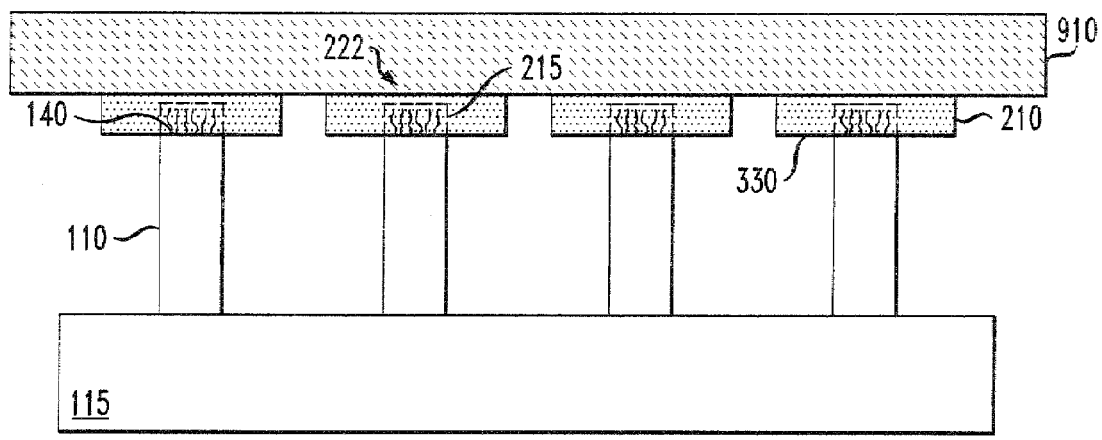
FIG. 9 shows a cross-sectional view of an example device after further covering the substrate having crystal-support-structures and III-V crystals thereon, with an adhesive layer.

FIG. 9 shows a cross-sectional view of the device 100 analogous to that depicted in FIG. 3, after further covering the substrate 115, having crystal-support-structures 110 and III-V crystals 210 thereon, with an adhesive layer 910. E.g., the device 100 at the stage of manufacture depicted in FIG. 3 can be covered with the adhesive layer 910. The upper surface 222 of the III-V crystal 210 adheres to the adhesive layer 910. In some cases, the adhesive layer 910 is a flexible polymer, such as polydimethylsiloxane (PDMS).

Figure 10:
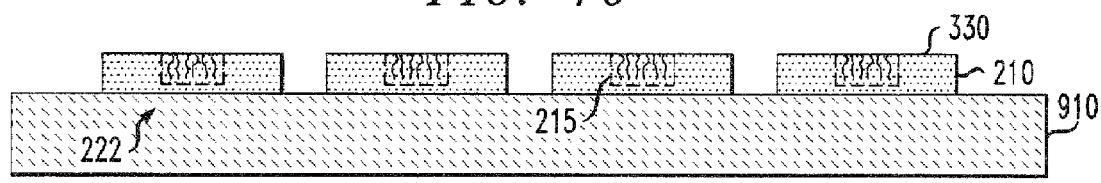
FIG. 10 shows a cross-sectional view of an example device after removing the adhesive layer from the substrate with the III-V crystals 210 attached thereto.

FIG. 10 shows a cross-sectional view of the device 100 after removing the adhesive layer 910 from the substrate 115 with the III-V crystals 210 attached thereto. Contact between the crystal-support-structure 110 (FIG. 9) and the III-V crystal 210 is broken. Consequently, the central defect region 215 of the III-V crystal 210 that was formerly adjacent to the contact region 140 of the support-structures 110 (FIG. 9) now faces away from the adhesive layer 910. In some instances, a portion of the crystal-support-structures 110 may remain attached to the III-V crystals 210. In such instances, the still-attached portion of crystal-support-structures 110 (FIG. 9) can be removed by exposing the device 100, including the crystal-support-structures 110 (FIG. 9), to an etchant. E.g., crystal-support-structures 110 made of silicon can be exposed to an etchant having hydrofluoric acid, nitric acid or mixtures thereof.

The III-V crystals 210 adhered to the adhesive layer 910 can then be coupled to conductive lines similar to that discussed above in the context of FIGS. 5 and 6, to form a flexible a light-emitting, light-detecting or transistor device 100.

Although the embodiments have been described in detail, those of ordinary skill in the art should understand that they could make various changes, substitutions and alterations herein without departing from the scope of the invention.

What is claimed is:

1. A device, comprising:
   a substrate having crystal-support-structures thereon; and
   a III-V crystal on a single contact region of one of said crystal-support-structures, wherein an area of said contact region is no more than about 50 percent of a surface area of said III-V crystal, and wherein said crystal-support-structures are made of silicon or sapphire.

2. The device of claim 1, wherein pillar-shaped ones of said crystal-support-structures have diameters that are about 10 percent or less of a lateral thickness of individual ones of said III-V crystal located on said pillar-shaped ones of said crystal-support-structures.

3. The device of claim 1, wherein said contact region is located on an upper surface of said crystal-support-structures.

4. The device of claim 1, wherein a crystal lattice of said contact region and a crystal lattice of said III-V crystal both have substantially hexagonal geometries.

5. The device of claim 1, wherein said III-V crystal has a substantially lower threading defect density outside of a defect region of said crystal than a threading defect density within said defect region, said defect region being located adjacent to said contact region.

6. A device, comprising:
   a substrate having crystal-support-structures thereon; and
   a III-V crystal on a single contact region of one of said crystal-support-structures, wherein an area of said contact region is no more than about 50 percent of a surface area of said III-V crystal, wherein said substrate and said crystal-support-structures are both made of silicon, and said III-V crystal includes one or more III-nitrides.

7. The device of claim 1, wherein said III-V crystal is a merged layer that touches a plurality said contact regions.

8. The device of claim 1, wherein said crystal-support-structures are electrically conductive and separated ones of said III-V crystals are connected to individual addressable electrically conductive lines.

9. The device of claim 1, wherein merged ones of said III-V crystals are light-emitting components or light-detecting components of said device.

10. A device, comprising:
    a III-V crystal having a uniform crystal orientation except for a defect region that is centrally located in said III-V crystal, wherein said defect region occupies less than about 10 percent of a total volume of said III-V crystal; and
    a crystal-support-structure on a substrate, said a III-V crystal being located on a single contact region of said crystal-support-structure, wherein an area of said contact region is no more than about 50 percent of a surface area of said III-V crystal, and wherein said crystal-support-structure is made of silicon or sapphire.

11. The device of claim 10, wherein a defect density of said defect region is about $1\times10^8$ cm$^{-2}$ or greater and a defect density of said III-V crystal outside of said defect region is less than about $1\times10^7$ cm$^{-2}$.

12. The device of claim 10, wherein said III-V crystal is adhered to an adhesive layer such that said central defect region faces away from said adhesive layer.

13. The device of claim 1, wherein said crystal-support-structures are made of silicon.

14. The device of claim 1, wherein said contact region has a substantially similar crystal lattice geometry as a crystal lattice geometry of said III-V crystal.

15. The device of claim 14, wherein said crystal lattice geometry of said III-V crystal has a hexagonal geometry and said crystal support structure has a (111) orientation thereby providing a hexagonal arrangement of atoms in said contact region.

16. The device of claim 14, wherein said crystal lattice geometry of said III-V crystal has a cubic geometry and said crystal support structure has a (100) orientation thereby providing a cubic arrangement of atoms in said contact region.

17. The device of claim 1, wherein a diameter of pillar-shaped ones of said crystal support structure are about 10 percent or less than a diameter of said III-V crystal.

18. The device of claim 1, wherein said area of said contact region is no more than about 10 percent of said surface area of said III-V crystal.

19. The device of claim 1, wherein said area of said contact region is no more than about 1 percent of said surface area of said III-V crystal.

20. The device of claim 1, wherein said crystal-support-structures are made of sapphire.

* * * * *